United States Patent

[11] 3,596,205

[72] Inventor Morris Ribner
Chicago, Ill.
[21] Appl. No. 850,556
[22] Filed Aug. 15, 1969
[45] Patented July 27, 1971
[73] Assignee International Telephone and Telegraph Corporation
New York, N.Y.

[54] LEVEL REGULATOR FOR AN OSCILLATOR
7 Claims, 2 Drawing Figs.

[52] U.S. Cl. 331/109, 331/117, 331/183
[51] Int. Cl. H03b 3/02
[50] Field of Search 331/109, 117, 183

*Primary Examiner*—John Kominski
*Attorneys*—C. Cornell Remsen, Jr., Walter J. Baum, Percy P. Lantzy, J. Warren Whitesel, Delbert P. Warner and James B. Raden

ABSTRACT: The amplitude level of an oscillator employing a transformer winding as a tank circuit is controlled by varying the gain in the tank circuit. This variation in gain is directly regulated by a transistor circuit connected in parallel with the input winding of the transformer. The level of conduction of the transistor, in turn, is determined by a feedback loop which interconnects the output of the oscillator and the transistor. Variations within the loop determining the level at which a stabilized amplitude is to exist are produced by varying a resistance which, in turn, varies the bias to an operational amplifier within the loop.

Figure 1:
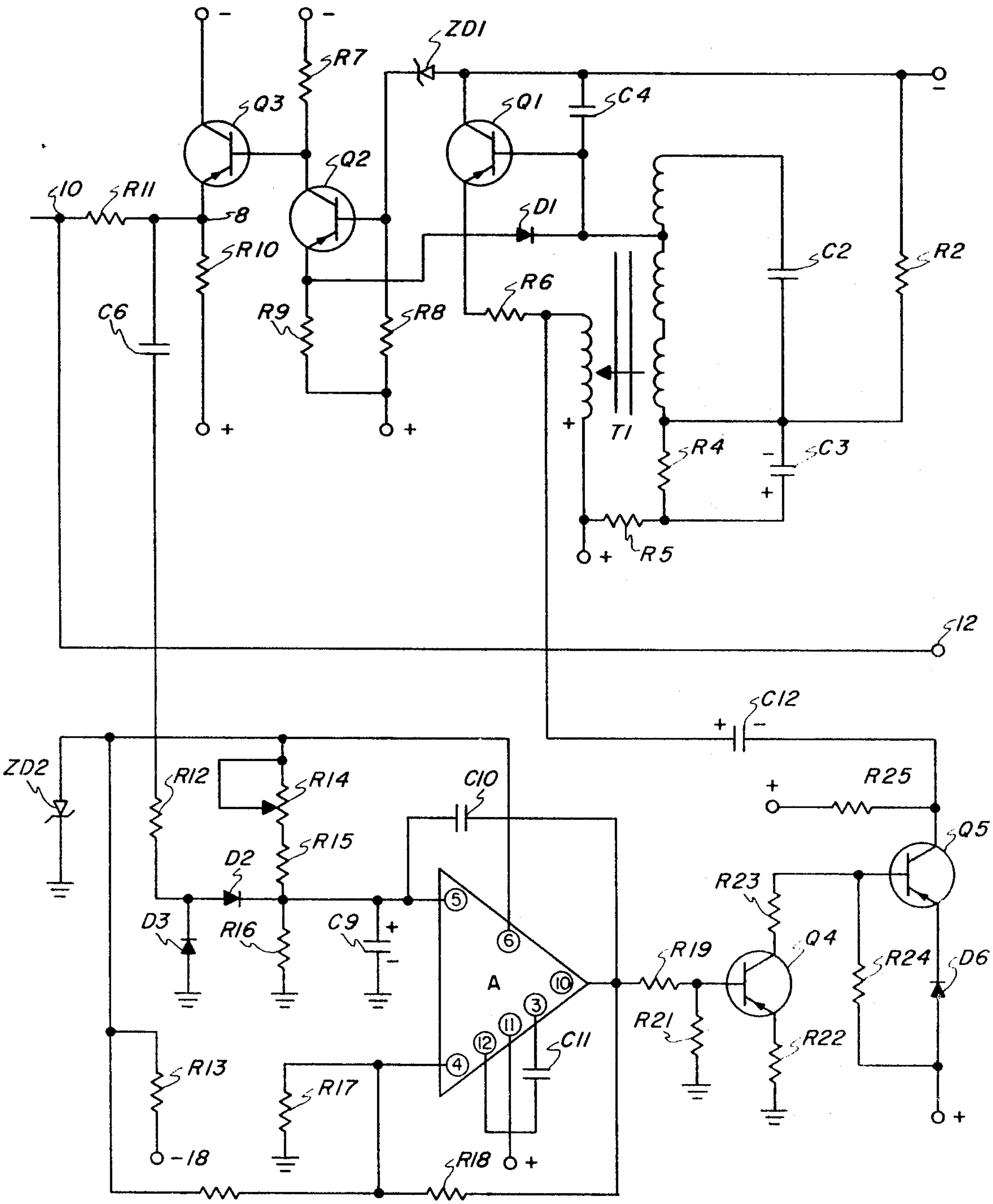

INVENTOR
MORRIS RIBNER

BY Delbert P. Warner
ATTORNEY

LEVEL REGULATOR FOR AN OSCILLATOR

An oscillator is provided having feedback means regulating the amplitude level of its output at any specific value over a relatively wide range, in accordance with the level desired. In particular, the equivalent of a resistor shunt is provided in parallel with the oscillator tank transformer primary to control the amplitude of the oscillator in accordance with the feedback signals. A capacitor is used between the tank circuit and the shunt to permit circuits to be at different DC voltage levels.

Some prior art oscillators for use in multiple frequency signalling systems have been made to operate at a single amplitude. As a consequence, it has been inconvenient to adjust the level of the signals to compensate for differences in the amplitudes of signals which are to be mixed together. Furthermore, many of the prior art amplifiers have not provided stable output signals.

It is an object of the present invention to provide oscillators capable of generating signals at various amplitudes for use in telephone systems. In particular, it is an object to provide means for controlling the amplitude of signals produced by such oscillators and for doing so over a relatively wide amplitude range. It is a further object to make it possible readily to adjust the amplitudes of two oscillators so that their outputs may be mixed together at the same or any desired ratios of amplitude levels.

The present invention involves an oscillator for use in providing signals of use in telephone switching systems. A plurality of oscillators in accordance with the invention would be required in many operable systems. For the sake of simplicity, only a single oscillator is disclosed in detail, but additional oscillators, which would be operable at different frequencies, would be made available in the number required in a practical system.

A circuit, according to the present invention, employs transistorized amplifier elements together with an integrated circuit operational amplifier to enable amplitude control in an oscillator. A feedback loop is provided through the operational amplifier to control the level of conduction of a transistor having its emitter-collector circuit connected in parallel to the primary winding of a tank circuit of the oscillator. Connecting, what is in effect a shunt resistance across the primary winding, in this manner makes it possible to alter the gain of the tank circuit in such a way that it alters the voltage to the control element of the associated transistor to increase or decrease the gain of the transistor and consequently the amplitude of the output signal.

Figure 2:
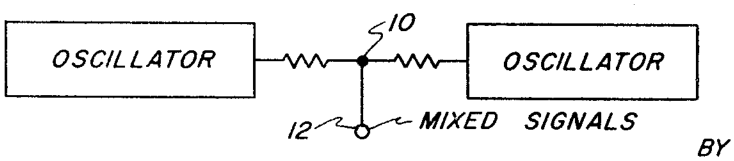

The novel features that I consider characteristic of my invention are set forth with particularity in the appended claims. The invention itself, however, both as to its organization and its method of operation, together with additional objects and advantages thereof, will best be understood from the following description of a specific embodiment read in connection with the accompanying drawing, in which:

FIG. 1 illustrates in detail a preferred circuit for the practice of the invention, and FIG. 2 is a block diagram illustrating a way of interconnecting two oscillators of the kind shown in FIG. 1 in order to derive a two-frequency signal.

As previously indicated, the illustrated circuit is intended primarily as an oscillator, the amplitude of the output of which may be regulated at any level within a very wide range. Also, as previously indicated, several oscillators of the type illustrated in FIG. 1 will be employed in signalling systems requiring the provision of tones in pairs. All of the oscillators and the associated regulator circuits may be identical to each other in all important respects except for differences required to cause them to operate at different frequencies.

Considering FIG. 1, it will be noted that the transistor, Q1, is coupled to a transformer circuit, T1, in its base and emitter circuits. This arrangement provides a voltage gain and phase shift between the emitter and the base which causes oscillation in the circuit. The oscillator frequency is adjustable over a limited range, of the order of plus or minus 10 percent, by means of a tuning slug indicated by the arrow in the ferrit transformer core. The oscillator's stability is improved by the use of an emitter resistor, R6. An oscillator of this type is subject to variations of amplitude due to effects of changes in ambient conditions and to variations in manufacturing tolerances. In order to maintain uniformity in the output level over the full operating range, an amplitude regulation circuit is used in a feedback loop.

Amplitude regulation is provided by sensing the level which activates the control circuit at the most distant point of the oscillator signal path which is practical before actual mixing with other tones is attempted. For this reason, the oscillator output is fed directly through a zener diode, ZD1, to a buffer amplifier, Q2. The Zener diode functions simply to displace the DC collector voltage level of Q1 to a level which is more desirable for base bias operation of transistor Q2. Transistor Q2 directly couples from its collector circuit to the base of transistor Q3. It will be noted that transistor Q3 is an emitter follower circuit and that control feedback is taken from the emitter of the transistor Q3. The emitter of transistor Q3 is connected by a summing resistor, R11, to a terminal at 10. Terminal 10, by virtue of its isolation from the oscillator Q1, by transistor Q2 and Q3 and by similar isolating elements to another oscillator, as indicated in FIG. 2, serves as a mixing point at which tones from two oscillators may be combined and transmitted out over an output terminal at 12, without either oscillator exerting any influence over the other.

Regulation of the oscillator from transistor Q3 onward, begins at the terminal 8. The output impedance of the transistor is much lower than the resistance R11 and prevents interference between output signals on terminal 8 and mixed signals at terminal 10. Terminal 8 is coupled through an RC network, C6 and R12, to a rectifier circuit including diodes D2 and D3. The resulting rectified or DC signal is proportional to the oscillator output amplitude and is smoothed by the integrator formed by capacitor C9 in conjunction with R16 before being supplied as one input at terminal 5 of an integrated circuit in the form of an operational amplifier, A. The amplifier, A, is normally biased through the resistor, R17, at input terminal 4 so that, in the absence of any input signal (indicating a complete loss of the feedback signal into terminal 5), the shunting effect of the control transistor, Q5, across the primary winding of transformer, T1, is nil. Under these circumstances the output signal produced by the Oscillator, Q1, is at its maximum amplitude level. This output maximizing bias is derived from a common −12 volt source obtained from a Zener Diode, ZD2, which reduces a −18 volt supply to that level. It is desirable that some usage be had of signals if such a failure occurred rather than having none at all. The −12 volt source voltage is also used to supply the negative voltage bias to terminal 5 of the operational amplifier, A. The effect of the two input voltages to terminal 5 is to balance the oscillator output at a level which is determined primarily by the loop gain and the bias existing at terminal 4 and which is most conveniently controlled by the value to which a variable resistor, R14, is set in series with a resistor, R15. Resistors R17 and R18 provide DC as well as AC negative feedback. Capacitor C10 compensates for high frequency phase shift. In addition, capacitor C11 is used to apply a dominant lag to the overall amplifier frequency characteristics.

The output of the operational amplifier, A, is fed from the voltage divider formed by R19 and R21 to a transistor, Q4, which, through resistor R23, acts as the driver for the control (or second) transistor, Q5. Both Q4 and Q5 are normally in continuous partial conduction when the amplitude is being controlled. In this way, they provide the specific shunting resistance value across the transformer winding which is required to maintain the output at the level desired for the particular circuit conditions.

While the principles of the invention have been described above in connection with specific apparatus and applications, it is to be understood that this description is made only by way of example and not as a limitation on the scope of the invention.

I claim:

1. An audio frequency oscillator control circuit comprising an oscillator circuit including a first transistor,
the oscillator circuit including a transformer coupled between the emitter and the base of the first transistor to provide voltage gain and phase shift and thus enable oscillation,
a second transistor coupled across input terminals of the transformer for controlling the amplitude of oscillator signals, and
a feedback loop connected between the collector of said first transistor and a control element of the second transistor to provide signals to regulate the oscillator amplitude.

2. A circuit, as claimed in claim 1, in which the feedback loop includes
an operational amplifier coupled to provide control signals to the second transistor, and
means for biasing the operational amplifier so that, in the absence of a signal from the oscillator circuit, the operational amplifier will turn the second transistor "off" to permit a maximum signal amplitude from the oscillator.

3. A circuit, as claimed in claim 1, in which the feedback loop includes
an operational amplifier coupled to control the second transistor, and
means for altering the bias to said operational amplifier to produce a change in the signal to the second amplifier and thereby alter the stabilized amplitude of the signal from the oscillator.

4. A circuit, as claimed in claim 1, in which
said circuit is coupled through buffer means and a summing resistor to a terminal, and
a second circuit, identical to the circuit of claim 1 except for differences necessary to generate a different frequency, is coupled through additional buffer means and a summing resistor to the same terminal,
whereby signals from the two circuits may be mixed together at the common terminal to provide a multifrequency signal.

5. A circuit, as claimed in claim 4, in which
the buffer means includes at least one transistor amplifier connected as an emitter follower for the final output circuit through the summing resistor to the terminal, and
the buffer means includes a connection directly from its emitter through an RC circuit to the feedback loop.

6. A circuit, as claimed in claim 1, in which
the transformer has a primary winding connected in series with the emitter of the first transistor and in shunt with the emitter-collector circuit of the second transistor, and
the transformer has a secondary winding coupled to the base of the first transistor to provide control to the first transistor.

7. A circuit, as claimed in claim 1, in which
the second transistor is coupled to the first through a DC isolation capacitor.